United States Patent
Nakashima et al.

(10) Patent No.: US 7,476,451 B2
(45) Date of Patent: Jan. 13, 2009

(54) ELECTROLUMINESCENT ELEMENT AND LIGHT EMITTING DEVICE

(75) Inventors: Harue Nakashima, Kanagawa (JP); Satoshi Seo, Kanagawa (JP); Takako Takasu, Kanagawa (JP); Hiroko Yamazaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/715,106

(22) Filed: Nov. 17, 2003

(65) Prior Publication Data

US 2004/0247936 A1 Dec. 9, 2004

(30) Foreign Application Priority Data

Nov. 21, 2002 (JP) ............................ 2002-337623

(51) Int. Cl.
*H01L 51/50* (2006.01)
(52) U.S. Cl. .................... 428/690; 428/917; 313/504; 313/506
(58) Field of Classification Search ................ 428/690, 428/917; 313/504, 506
See application file for complete search history.

(56) References Cited

U.S. PATENT DOCUMENTS

| | | | | |
|---|---|---|---|---|
| 5,405,709 | A * | 4/1995 | Littman et al. ............. | 428/690 |
| 6,316,786 | B1 * | 11/2001 | Mueller et al. ............. | 257/40 |
| 6,614,176 | B2 * | 9/2003 | Kim et al. .................. | 313/506 |
| 6,680,132 | B2 * | 1/2004 | Shi et al. .................... | 428/690 |
| 7,199,515 | B2 | 4/2007 | Seo et al. | |
| 2002/0045063 | A1 | 4/2002 | Kim et al. .................. | 428/690 |
| 2002/0045064 | A1 | 4/2002 | Kim et al. .................. | 428/690 |
| 2002/0045065 | A1 | 4/2002 | Kim et al. .................. | 428/690 |
| 2003/0127967 | A1 | 7/2003 | Tsutsui et al. | |
| 2004/0046495 | A1 * | 3/2004 | Peng ........................... | 313/504 |
| 2004/0124766 | A1 * | 7/2004 | Nakagawa et al. ......... | 313/504 |
| 2005/0156197 | A1 | 7/2005 | Tsutsui et al. | |
| 2006/0091797 | A1 | 5/2006 | Tsutsui et al. | |

FOREIGN PATENT DOCUMENTS

| | | | |
|---|---|---|---|
| JP | 02-008290 | * | 1/1990 |
| JP | 10-053759 | | 2/1998 |
| JP | 2001-043976 A | * | 2/2001 |

OTHER PUBLICATIONS

International Search Report re application No. PCT/JP03/14381 mailed Feb. 17, 2004.

(Continued)

*Primary Examiner*—Dawn Garrett
(74) *Attorney, Agent, or Firm*—Cook Alex Ltd.

(57) ABSTRACT

There is provided an electroluminescent element using a material that is excellent in film forming properties and carrier transporting properties, emits a light in the solid state, and can be suitably used also as a host material. The electroluminescent element has an electroluminescence layer between a couple of electrodes, and a complex of a Group 4 metal of the periodic table, which is excellent in the film forming properties and the carrier transporting properties and capable of emitting a light in the solid state, is used in a part of the electroluminescence layer to form the electroluminescent element. The complex of a Group 4 metal of the periodic table has an emission wavelength on a longer wavelength side as compared with conventional host materials such as $Alq_3$, and thereby may be combined with a red light emitting guest material to form a light emitting layer.

16 Claims, 12 Drawing Sheets

OTHER PUBLICATIONS

Hamada, Y., et al, "Red Organic Light-Emitting Diodes Using an Emitting Assist Depont," Applied Physics Letters, vol. 75, No. 12, pp. 1682-1684, Sep. 20, 1999.

Written opinion re PCT application No. PCT/JP03/14381, dated May 25, 2004, (with English translation).

Sato et al, Molecular Electronics and Bioelectronics, vol. 11, No. 1, pp. 86-99 (2000), no month.

Kido et al, Organic Electroluminescence Materials and Displays, pp. 148-160, Feb. 28, 2001.

* cited by examiner

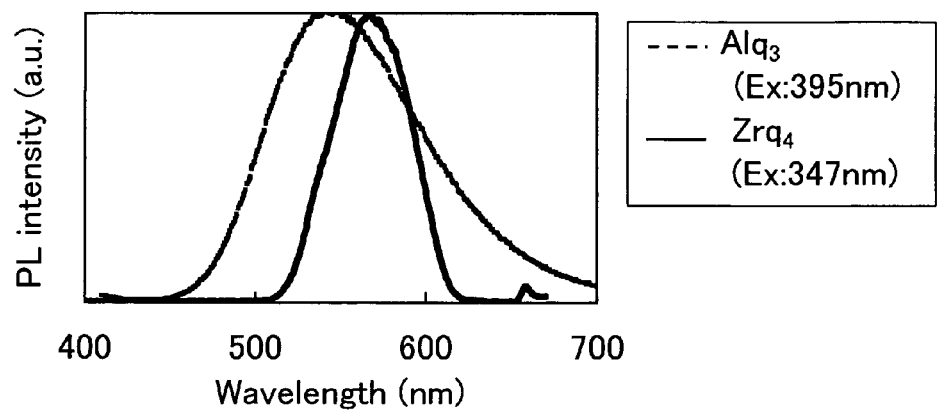
Fig.8A  PL spectrums of thin films
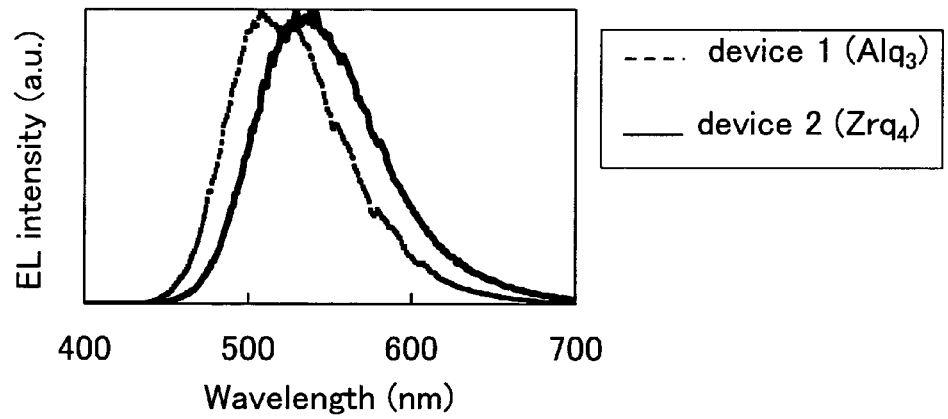
Fig.8B  EL spectrums of electroluminescence devices

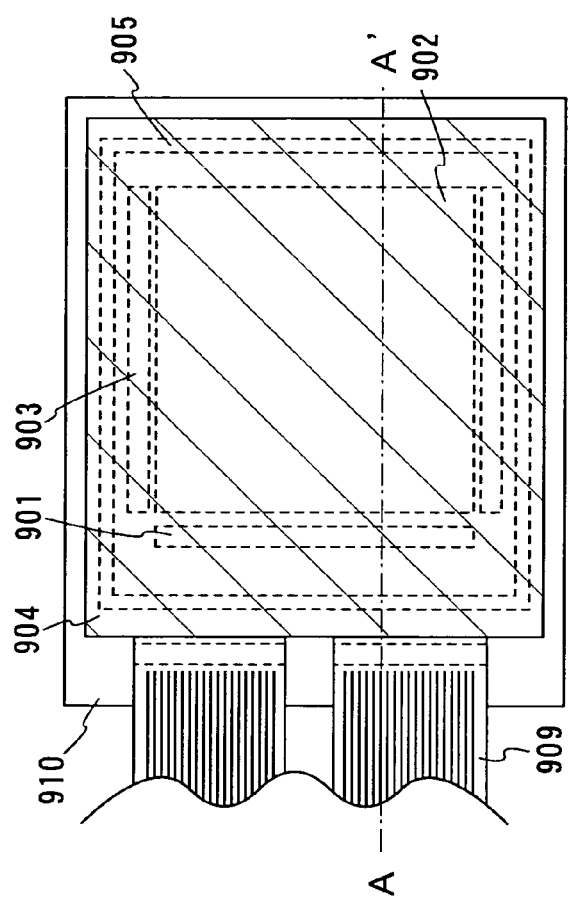
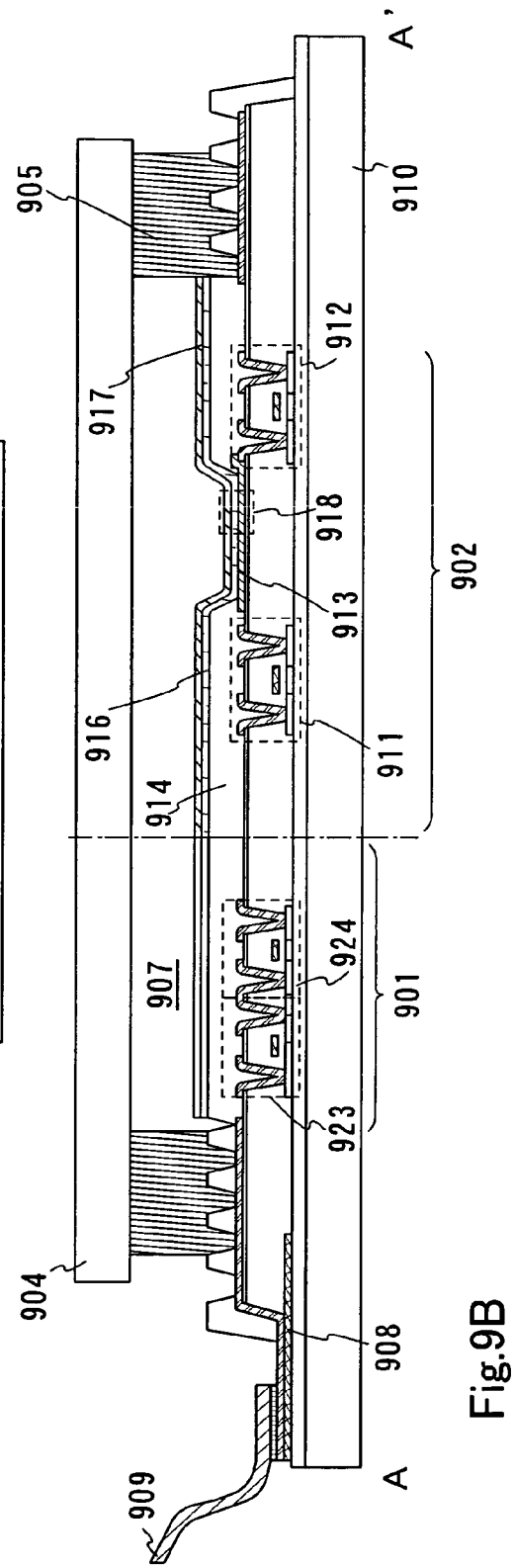
Fig.9A
Fig.9B

Fig.10A
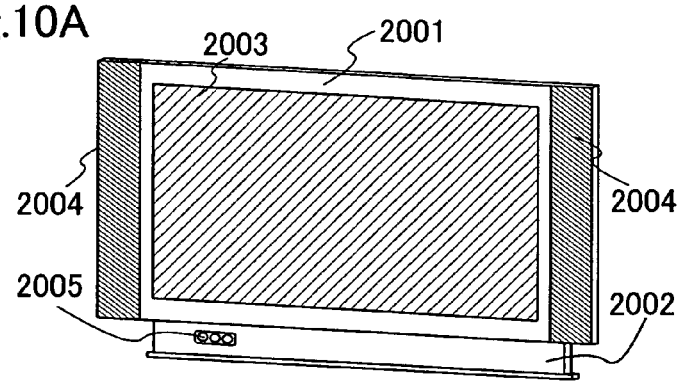
Fig.10B
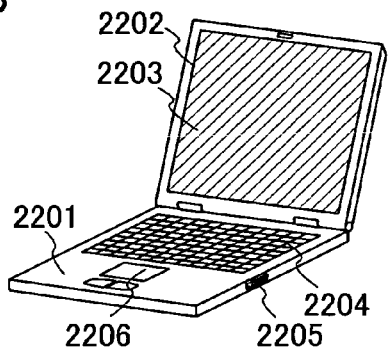
Fig.10C
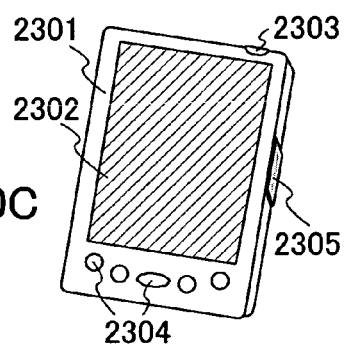
Fig.10D
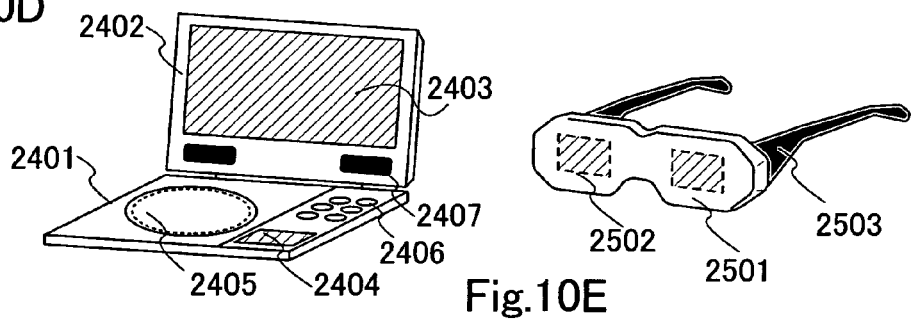
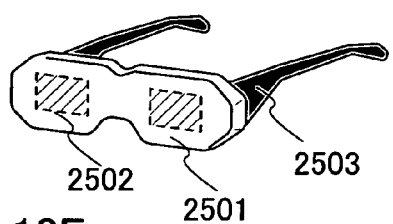
Fig.10E
Fig.10F
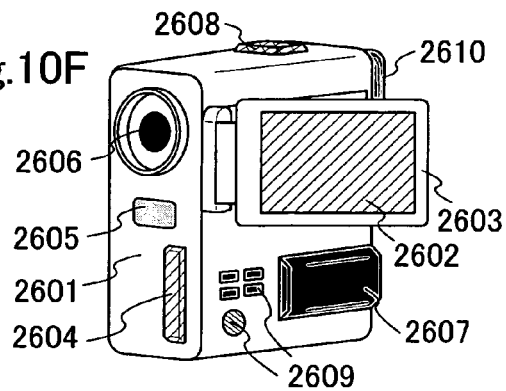
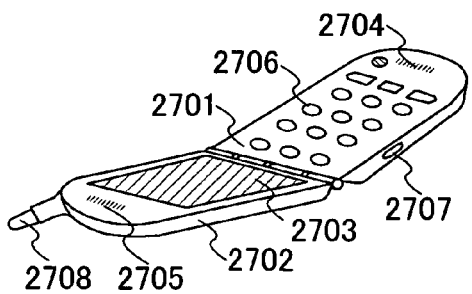
Fig.10G

ELECTROLUMINESCENT ELEMENT AND LIGHT EMITTING DEVICE

TECHNICAL FIELD

The present invention relates to an electroluminescent element using a metal complex in an electroluminescence layer formed between a pair of electrodes.

BACKGROUND OF THE INVENTION

Electroluminescent elements using a luminous body of a material with features of thinness, lightweight, rapid response, low-direct-voltage driving, etc. have been expected to be applied to next-generation flat panel displays. Further, as compared with conventional liquid crystal displays, light emitting devices comprising the electroluminescent elements arranged into a matrix are advantageously viewable at wider angles to have more excellent visibility.

The light emission mechanism of the electroluminescent elements is said to be such that, when an electroluminescence layer is disposed between a couple of electrodes and voltage is applied to the electrodes, electrons injected from a cathode and holes injected from an anode are recombined in the luminescence center of the electroluminescence layer to form molecular excitons, and the molecular excitons are returned to the ground state while releasing energy to emit a light. Singlet excited state and triplet excited state are known as the excited state, and it is believed that the light can be emitted through either excited state.

The light emitting materials, which determine luminescent color of the electroluminescent elements, have variedly been studied. In particular, preferred are materials that can be formed into a film without cohesion upon the film formation to be excellent in film forming properties, have excellent carrier transporting properties, and can emit a light in the solid state.

The luminescent color may be the color in which the above material itself has independently, and may be controlled by a so-called doping method in which the material is used as a host material and doped with a guest material (or a dopant material).

The doping method has a merit that a different luminescent color can be obtained by doping one host material with a different guest material. In the doping method, concentration quenching of the light emitting molecules can be prevented to achieve a high luminance and a high efficiency. Thus, the doping method is effective particularly for red light emitting materials, which are likely to be concentration-quenched. However, at the moment there are few materials that can be suitably used as the host material.

The relation between the host material and the guest material is required to satisfy the basic condition that the HOMO-LUMO level of the guest material is within the HOMO-LUMO gap of the host material. To transfer the energy more efficiently, it is preferred that the maximum emission wavelength of the host be closer to the maximum absorption wavelength of the guest.

However, in red light emission using the conventional host materials, there is a large energy gap between the host material and the red light emitting guest material, so that a problem arises that the energy cannot be efficiently transferred from the host material to the guest material.

For example, tris(8-quinolinolato)aluminum (hereinafter referred to as $Alq_3$) has been widely used as the host material because it can emit a light in the solid state and is excellent in electron transporting properties, film forming properties, and film qualities. However, as reported in Yoshiharu Sato, *Molecular Electronics and Bioelectronics*, 86-99 (2000) (reference 1), etc., in the case of forming the light emitting layer by codepositing $Alq_3$ and the red light emitting guest material, because $Alq_3$ has a maximum fluorescence wavelength ($\lambda_{max}$) of 530 to 540 nm while the red light emitting guest material has a maximum fluorescence wavelength of 560 to 680 nm, the energy is not smoothly transferred and light emission is provided not only by the guest material but also by the host material, whereby it is difficult to obtain the red light emission with an excellent color purity.

It has been reported as a solution of the problem that, by doping with an auxiliary material such as rubrene having a maximum fluorescence wavelength between those of the host material $Alq_3$ and the red light emitting guest material such as DCM2, the energy is smoothly transferred from the host material through the auxiliary material to the guest material and thus only the red light of the guest material can be efficiently obtained (Yuji Hamada, Hiroshi Kanno, Tsuyoshi Tsujioka, Hisakazu Takahashi and Tatsuro Usuki, *Red organic light-emitting diodes using an emitting assist dopant, Applied Physics Letters*, vol. 75, No. 12, 1682-1684 (1999) (reference 2), etc.)

However, such a method using more materials is disadvantageous in that it is difficult to control the codeposition conditions and that the material loss is increased, thereby requiring further improvement.

Accordingly, an object of the present invention is to provide an electroluminescent element using a material, which is formed into a film without cohesion upon the film formation to be excellent in film forming properties, has excellent carrier transporting properties, emits a light in the solid state, and can be suitably used also as a host material.

Further, another object of the invention is to provide an electroluminescent element using a material, which is used as a host material suitably for efficiently transferring energy to a red light guest material, particularly in case of a red light emission that a maximum absorption wavelength of the guest material is a longer wavelength side.

SUMMARY OF THE INVENTION

The inventors have found that a complex of a Group 4 metal of the periodic table is excellent in film forming properties and carrier transporting properties, and emits a light in the solid state as described above. Thus, the inventors have made a suggestion of using the complex of a Group 4 metal of the periodic table in an electroluminescence layer disposed between a couple of electrodes of an electroluminescent element.

The complex of a Group 4 metal of the periodic table has luminescent properties and may be singly formed into the electroluminescence layer. Further, the complex is particularly suitably used as a host material in combination with a guest material for forming the electroluminescence layer because the complex has an emission wavelength on a longer wavelength side as compared with conventional host materials such as $Alq_3$ and can reduce the energy gap, which becomes a problem particularly in the case of using a red light emitting guest material in combination.

In this case, a material, which emits a red light and preferably has an emission wavelength with a maximum value within a range of 580 to 680 nm, is characteristically used as a known guest material.

Further, in the complex of a Group 4 metal of the periodic table, the central metal is preferably an 8-coordination metal such that four bidentate chelating ligands are coordinated thereto. Therefore, preferred among metals of Group 4 of the periodic table are those with a large ionic radius such as zirconium (Zr) and hafnium (Hf).

Thus, an aspect of the present invention is an electroluminescent element comprising at least an anode, a cathode, and an electroluminescence layer, characterized in that the electroluminescence layer comprises a complex of a Group 4 metal of the periodic table represented by the general formula [Formula 1]:

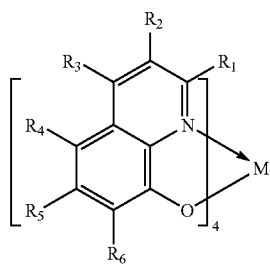

[Formula 1]

wherein M represents a Group 4 element of the periodic table, and R1 to R6 independently represent a hydrogen, a halogen, a cyano group, an alkyl group having 1 to 10 carbon, a haloalkyl group having 1 to 10 carbon atoms, an alkoxyl group having 1 to 10 carbon atoms, a substituted or unsubstituted aryl group, or a substituted or unsubstituted heterocycle residue.

There is further provided the electroluminescent element according to the above aspect, characterized in that the electroluminescence layer has a laminate structure and emits a white light.

Another aspect of the invention is an electroluminescent element comprising at least an anode, a cathode, and an electroluminescence layer, characterized in that the electroluminescence layer comprises a light emitting layer containing a complex of a Group 4 metal of the periodic table represented by the general formula [Formula 1]:

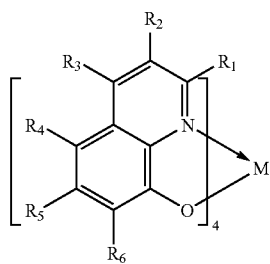

[Formula 1]

wherein M represents a Group 4 element of the periodic table, and R1 to R6 independently represent a hydrogen, a halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocycle residue.

There is further provided the electroluminescent element according to the above aspect, characterized in that the light emitting layer contains the complex of a Group 4 metal of the periodic table represented by the general formula [Formula 1] and a guest material.

According to the present invention, there is provided an electroluminescent element with excellent properties using a complex of a Group 4 metal of the periodic table partly. Particularly in the case of using the complex of a Group 4 metal of the periodic table as a host material for a red light emitting layer, because the complex has an emission wavelength on a longer wavelength side as compared with conventional materials, energy is efficiently transferred to a red light emitting guest material to increase the light emitting efficiency of the electroluminescent element.

BRIEF DESCRIPTION OF THE DRAWINGS

FIGS. 8A and 8B are graphs showing PL and EL spectra of a Zr complex and an electroluminescent element using the same.

FIGS. 9A and 9B are views showing a light emitting device.

FIGS. 10A to 10G are views showing electronic apparatuses.

DETAILED DESCRIPTION OF THE PRESENTLY PREFERRED EMBODIMENTS

Figure 1:
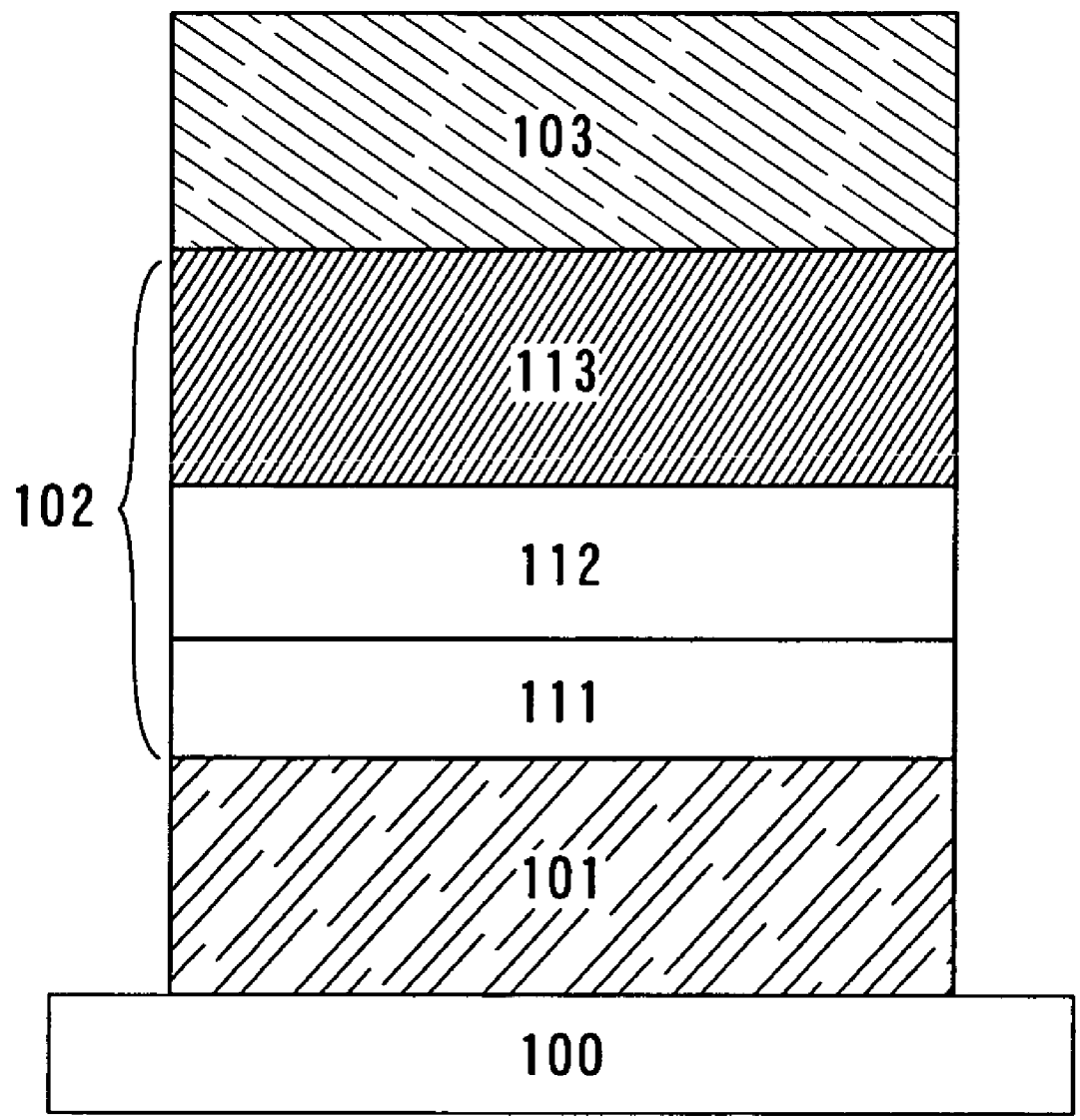
FIG. 1 is a view showing the structure of the electroluminescent element of Embodiment 1.

In the present invention, an electroluminescent element has such a basic structure that an electroluminescence layer (a hole injecting layer, a hole transporting layer, a light emitting layer, a blocking layer, an electron transporting layer, an electron injecting layer, etc.) is disposed between a pair of electrodes (an anode and a cathode), the electroluminescence layer containing a complex of a Group 4 metal of the periodic table represented by the general formula [Formula 1]:

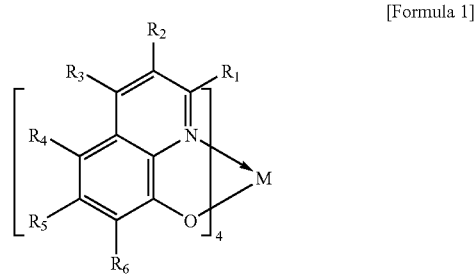

[Formula 1]

wherein M represents a Group 4 element of the periodic table, and R1 to R6 independently represent a hydrogen, a halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocycle residue.

The metal complex represented by the general formula [Formula 1] uses a metal of Group 4 of the periodic table, such as Zr and Hf, as the central metal. Specifically, the structure of the electroluminescent element is such that the electroluminescence layer contains the metal complex represented by the chemical formula [Formula 2], the chemical formula [Formula 3] provided by introducing a methyl group to the 2-position (R1) of the 8-quinolinol of the general formula [Formula 1], the chemical formula [Formula 4] provided by introducing a methyl group to the 5-position (R4) of the 8-quinolinol, the chemical formula [Formula 5] provided by introducing methyl groups to the 2- and 4-positions (R1 and R3) of the 8-quinolinol, the chemical formula [Formula 6] provided by introducing a phenyl group to the 5-position (R4) of the 8-quinolinol, the chemical formula [Formula 7] provided by introducing a methyl group and a cyano group to the 2- and 5-positions (R1 and R4) of the 8-quinolinol, the chemical formula [Formula 8] provided by introducing a methyl group and a trifluoromethyl group to the 2- and 6-positions (R1 and R5) of the 8-quinolinol, the chemical formula [Formula 9] provided by introducing a methyl group and a methoxy group to the 2- and 4-positions (R1 and R3) of the 8-quinolinol, the chemical formula [Formula 10] provided by introducing a chlorine to the 5-position (R4) of the 8-quinolinol, or the chemical formula [Formula 11] provided by introducing chlorine to the 5- and 7-positions (R4 and R6) of the 8-quinolinol.

[Formula 2]

[Formula 3]

[Formula 4]

[Formula 5]

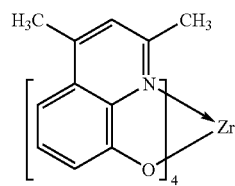

[Formula 6]

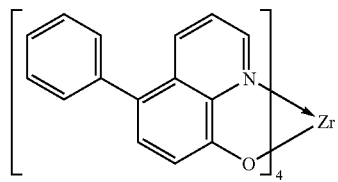

[Formula 7]

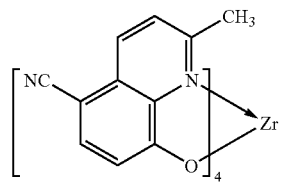

[Formula 8]

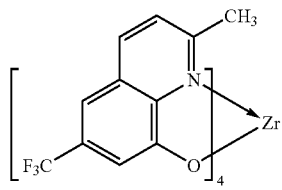

[Formula 9]

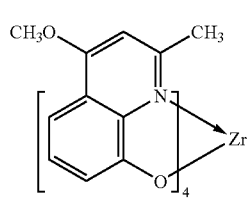

[Formula 10]

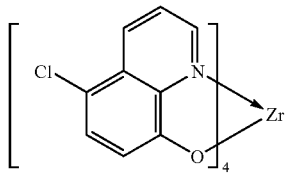

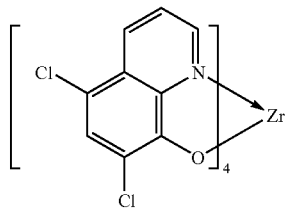

[Formula 11]

Though the complexes having the central metal of Zr are shown in the chemical formulae [Formula 2] to [Formula 11], the complex may have the central metal of Hf with a similar structure as shown in the chemical formula [Formula 12].

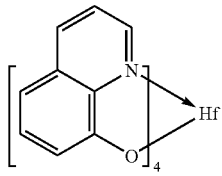

[Formula 12]

A known material other than the complex of a Group 4 metal of the periodic table may be used in the electroluminescence layer, and the material may be a low or high molecular weight material. The light emitting layer may comprise only an organic compound material, and may contain an inorganic compound partly.

The electroluminescent element of the invention has a structure of anode/hole injecting layer/light emitting layer/electron transporting layer/cathode; anode/hole injecting layer/hole transporting layer/light emitting layer/electron transporting layer/cathode; anode/hole injecting layer/hole transporting layer/light emitting layer/electron transporting layer/electron injecting layer/cathode; anode/hole injecting layer/hole transporting layer/light emitting layer/hole blocking layer/electron transporting layer/cathode; anode/hole injecting layer/hole transporting layer/light emitting layer/hole blocking layer/electron transporting layer/electron injecting layer/cathode; etc., and is characterized by using the complex of a Group 4 metal of the periodic table in the light emitting layer.

Embodiments of the invention are described in detail below.

EMBODIMENT 1

The structure of the electroluminescent element using only the complex of a Group 4 metal of the periodic table for forming the light emitting layer is described in Embodiment 1 with reference to FIG. 1.

The structure of FIG. 1 is such that a first electrode 101 is formed on a substrate 100, an electroluminescence layer 102 is formed on the first electrode 101, and a second electrode 103 is formed thereon.

The material used for the substrate 100 may be a glass, a quartz, a transparent plastic, etc., which has been used in conventional electroluminescent elements.

In Embodiment 1, the first electrode 101 acts as the anode, and the second electrode 103 acts as the cathode.

Thus, the first electrode 101 comprises an anode material, which is preferably a material with a large work function of 4.0 eV or more such as a metal, an alloy, an electrically conductive compound, and a mixture thereof. Specific examples of the anode materials include ITO (indium tin oxide), IZO (indium zinc oxide) prepared by mixing indium oxide with 2 to 20% of zinc oxide (ZnO), gold (Au), platinum (Pt), nickel (Ni), tungsten (W), chromium (Cr), molybdenum (Mo), iron (Fe), cobalt (Co), copper (Cu), palladium (Pd), nitrides of metal materials such as TiN, etc.

On the other hand, the cathode material for forming the second electrode 103 is preferably a material with a small work function of 3.8 eV or less such as a metal, an alloy, an electrically conductive compound, and a mixture thereof. Specific examples of the cathode materials include metals of Groups 1 and 2 of the periodic table, or alkaline metals such as Li and Cs, and alkaline earth metals such as Mg, Ca, and Sr; alloys thereof such as Mg:Ag and Al:Li, and compounds thereof such as LiF, CsF, and $CaF_2$; and transition metals including rare earth metals. The cathode may be formed by laminating a metal (or an alloy) such as Al, Ag, and ITO.

The anode material and the cathode material are formed into a film by a vapor deposition method, a sputtering method, etc. to prepare the first electrode 101 and the second electrode 103 respectively. The electrodes preferably have a thickness of 10 to 500 nm.

In the electroluminescent element of the invention, the light emitted by recombination of carriers in the electroluminescence layer is taken out from one or both of the first electrode 101 and the second electrode 103. Thus, the first electrode 101 is composed of a transparent material when the light is taken out from the first electrode 101, and the second electrode 103 is composed of a transparent material when the light is taken out from the second electrode 103.

The electroluminescence layer 102 is formed by stacking a plurality of layers. In Embodiment 1, the electroluminescence layer 102 is formed by stacking a hole injecting layer 111, a hole transporting layer 112, and an electron transporting light emitting layer 113.

In this case, the hole injecting material for forming the hole injecting layer 111 may be an organic compound, and porphyrin-based compounds such as phthalocyanine (hereinafter referred to as $H_2$—Pc) and copper phthalocyanine (hereinafter referred to as Cu—Pc) are effectively used as the organic compound. The hole injecting materials further include materials prepared by subjecting electrically conductive polymer compounds to chemical doping; polyethylene dioxythiophenes (hereinafter referred to as PEDOT) doped with polystyrene sulfonate (hereinafter referred to as PSS); polyanilines; polyvinylcarbazoles (hereinafter referred to as PVK); etc.

The hole transporting material for forming the hole transporting layer 112 is preferably an aromatic amine compound, which has a benzene ring-nitrogen bond. Examples of the materials widely used include TPD; derivatives thereof such as 4,4'-bis[N-(1-naphthyl)-N-phenyl-amino]biphenyl (hereinafter referred to as α-NPD); and starburst aromatic amine compounds such as 4,4',4"-tris(N,N-diphenyl-amino)-triphenylamine (hereinafter referred to as TDATA) and 4,4',4"-tris[N-(3-methylphenyl)-N-phenyl-amino triphenylamine (hereinafter referred to as MTDATA).

Further, the above complex of a Group 4 metal of the periodic table represented by the general formula [Formula 1] with the specific examples of the chemical formulae [Formula 2] to [Formula 12] is used for forming the electron transporting light emitting layer 113. The central metal of the complex is preferably Zr or Hf.

The electroluminescent element of Embodiment 1 is characterized in that the complex of a Group 4 metal of the periodic table, which is excellent in the film forming properties and the carrier transporting properties and emits a light in the solid state, is used for the electron transporting light emitting layer 113. The electroluminescent element utilizes only the light emitted by the complex as the luminescent color.

EMBODIMENT 2

Figure 2:
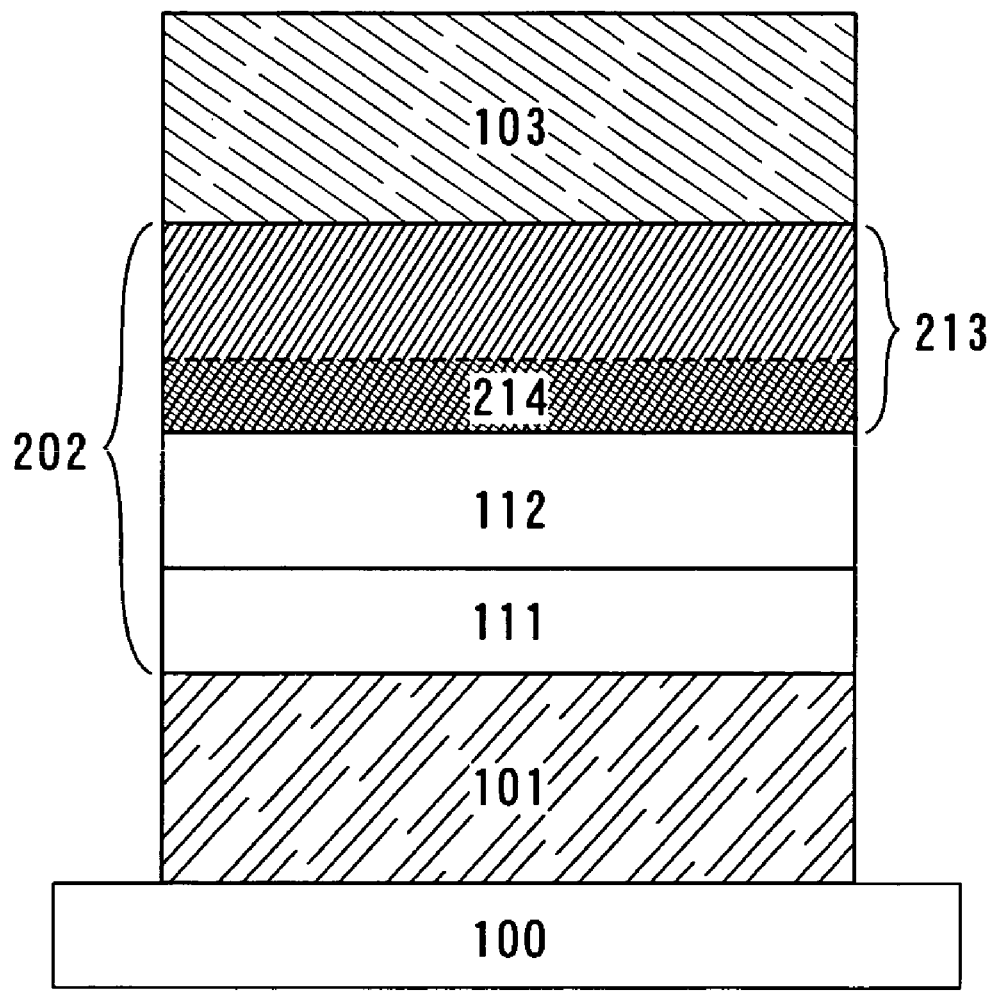
FIG. 2 is a view showing the structure of the electroluminescent element of Embodiment 2.

An electroluminescent element with an electroluminescence layer, which has a light emitting layer comprising a host material of the complex of a Group 4 metal of the periodic table and a guest material, is described in Embodiment 2 with reference to FIG. 2. The structure of Embodiment 2 is similar to the structure of Embodiment 1, and different from the structure of Embodiment 1 in that an electron transporting light emitting layer 213 comprises a portion composed of the complex of a Group 4 metal of the periodic table and a doping layer 214 formed by codeposition of the guest material.

The substrate, the first electrode, and the second electrode of Embodiment 2 may be formed in the same manner as Embodiment 1 using the same materials, whereby they are marked with the same reference signs and description thereof is omitted. Further, also the electroluminescence layer 202 is equal to that of Embodiment 1 except for the structure of the electron transporting light emitting layer 213, whereby the layers are marked with the same reference signs and description thereof is omitted.

In the electron transporting light emitting layer 213, the doping layer 214 is formed on a part of the surface in contact with the hole transporting layer 112.

The electron transporting light emitting layer 213 is composed of the above complex of a Group 4 metal of the periodic table represented by the general formula [Formula 1] with the specific examples of the chemical formulae [Formula 2] to [Formula 12], and the doping layer 214 is formed by codepositing the complex of a Group 4 metal of the periodic table and the guest material. The central metal of the complex is preferably Zr or Hf.

The guest material may be a known material, and specific examples thereof include DCM1, DCM2, DCJT, quinacridone, diethylquinacridone (DEQ), rubrene, perylene, DPT, Co-6, PMDFB, BTX, ABTX, etc.

The electroluminescent element of Embodiment 2 is characterized in that the complex of a Group 4 metal of the periodic table is used as the host material in the electron transporting light emitting layer 213, and utilizes the light emitted by the guest material as the luminescent color such that the energy is transferred from the host material to the guest material.

In Embodiment 2, the host material of the complex of a Group 4 metal of the periodic table has an emission wavelength on a longer wavelength side as compared with conventional host materials such as $Alq_3$, whereby efficient light emission can be achieved particularly in the case of combining the complex with a red light emitting guest material such as DCM1, DCM2, and DCJT.

EMBODIMENT 3

Figure 3:
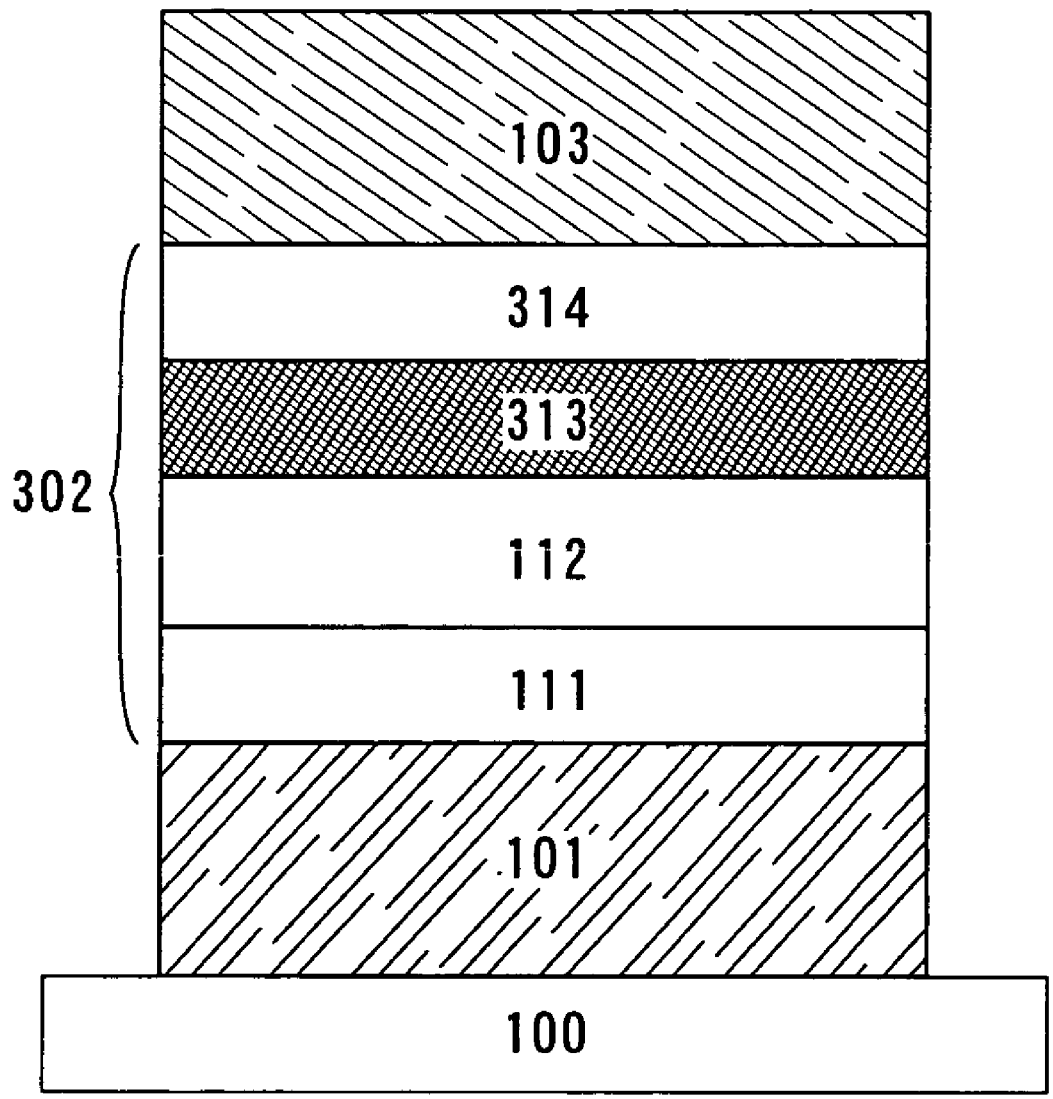
FIG. 3 is a view showing the structure of the electroluminescent element of Embodiment 3.

An electroluminescent element with an electroluminescence layer, which has a light emitting layer comprising a host material of the complex of a Group 4 metal of the periodic table and a guest material, is described in Embodiment 3 with reference to FIG. 3. The structure of Embodiment 3 is characterized in that the light emitting layer 313 is formed by codepositing the host material and the guest material and that an electron transporting layer 314 is disposed between the light emitting layer 313 and the second electrode 103.

The substrate, the first electrode, and the second electrode of Embodiment 3 may be formed in the same manner as Embodiment 1 using the same materials, whereby they are marked with the same reference signs and description thereof is omitted. Further, the electroluminescence layer 302 is equal to that of Embodiment 1 except for the structures of the light emitting layer 313 and the electron transporting layer 314, whereby the layers are marked with the same reference signs and description thereof is omitted.

The light emitting layer 313 is formed by codepositing the above complex of a Group 4 metal of the periodic table represented by the general formula [Formula 1] with the specific examples of the chemical formulae [Formula 2] to [Formula 12]. The central metal of the complex is preferably Zr or Hf.

The guest material may be a known material, and specific examples thereof include DCM1, DCM2, DCJT, quinacridone, diethylquinacridone (DEQ), rubrene, perylene, DPT, Co-6, PMDFB, BTX, ABTX, etc.

Preferred electron transporting materials for forming the electron transporting layer 314 include the above described metal complexes with a quinoline or benzoquinoline skeleton, such as $Alq_3$, $Almq_3$, and $BeBq_2$; mixed ligand complexes such as $BAlq_2$; etc. Further, the electron transporting materials include metal complexes with an oxazole- or thiazole-based ligand such as $Zn(BOX)_2$ and $Zn(BTZ)_2$. Furthermore, other than the metal complexes, the usable electron transporting materials include oxadiazole derivatives such as 2-(4-biphenylyl)-5-(4-tert-butylphenyl)-1,3,4-oxadiazole (hereinafter referred to as PBD) and 1,3-bis[5-(p-tert-butylphenyl)-1,3,4-oxadiazole-2-yl]benzene (hereinafter referred to as OXD-7); triazole derivatives such as 3-(4-tert-butylphenyl)-4-phenyl-5-(4-biphenylyl)-1,2,4-triazole (hereinafter referred to as TAZ) and 3-(4-tert-butylphenyl)-4-(4-ethylphenyl)-5-(4-biphenylyl)-1,2,4-triazole (hereinafter referred to as p-EtTAZ); and phenanthroline derivatives such as bathophenanthroline (hereinafter referred to as BPhen) and bathocuproine (hereinafter referred to as BCP).

The electroluminescent element of Embodiment 3 is characterized in that the complex of a Group 4 metal of the periodic table is used as the host material in the light emitting layer 313, and utilizes the light emitted by the guest material as the luminescent color such that the energy is transferred from the host material to the guest material. Further, the electroluminescent element has the structure that the electron transporting layer 314 is sandwiched between the light emitting layer 313 and the second electrode 103, and thereby is advantageous not only in that the properties of transporting electrons to the light emitting layer 313 are increased but also in that the light provided by the light emitting layer is prevented from being quenched in the vicinity of the second electrode.

In Embodiment 3, the host material of the complex of a Group 4 metal of the periodic table has an emission wavelength on a longer wavelength side as compared with conventional host materials such as $Alq_3$, whereby efficient light emission can be achieved particularly in the case of using the complex in combination with a red light emitting guest material such as DCM1, DCM2, and DCJT. The structure of Embodiment 3 is suitable for a red light emitting material because the material has an emission wavelength on a longer wavelength side and the red light is easily quenched.

EXAMPLE 1

Synthesis Examples of the complex of a Group 4 metal of the periodic table and Examples of the invention will be described below without intention of restricting the invention thereto.

SYNTHESIS EXAMPLE 1

In Synthesis Example 1, a method for synthesizing a Zr complex tetrakis(8-quinolinolato)zirconium (IV), which is a complex of a Group 4 metal of the periodic table with the central metal of Zr, is described.

Figure 11A:
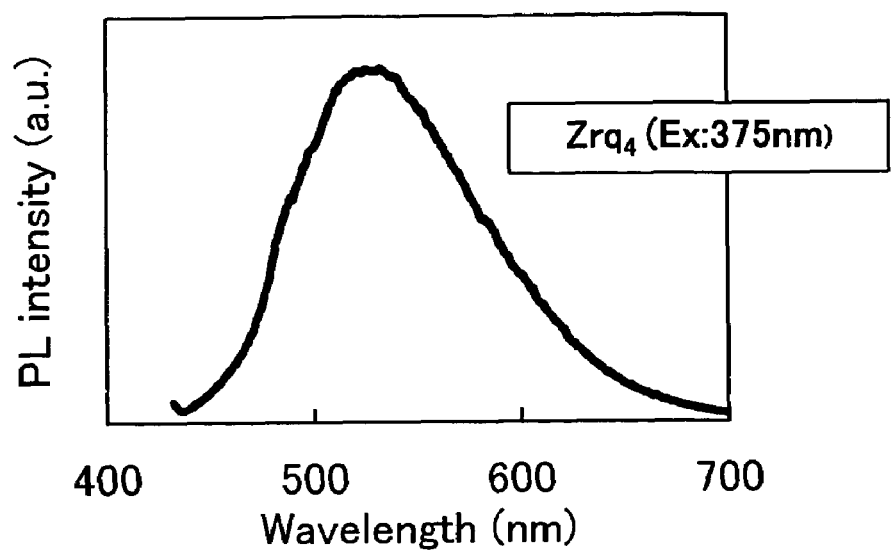
FIGS. 11A and 11B are graphs showing PL spectra of Zr complexes in methanol.

A solution prepared by dissolving 2.90 g (20 mmol) of 8-hydroxyquinoline represented by the chemical formula [Formula 13] in 100 ml of methanol was mixed with a solution dissolving 1.17 g (5 mmol) of zirconium (IV) chloride in 10 ml of methanol at the mole ratio of 4:1, and refluxed for about 1 to 2 hours to obtain yellow precipitates. An alkaline morpholine solution prepared by dissolving 1.74 g (20 mmol) of morpholine in 60 ml of methanol was added to the yellow precipitates with a pH value of 1 such that the amount of morpholine was 4 equivalents based on zirconium (IV) chloride, whereby the pH value was adjusted to 7 to obtain further yellow precipitates. Then, the resultant mixture was refluxed for about 4 hours again, and the reaction was quenched. The yellow precipitates were filtrated under a reduced pressure and dried in a vacuum oven. The crude yield was 94%. The crude product was purified by sublimation with a temperature gradient of 200 to 300° C. to obtain yellow powder of tetrakis (8-hydroxy-quinolinolato)zirconium (IV) ($Zrq_4$) of the chemical formula [Formula 2]. As a result of irradiating a methanol solution of the tetrakis(8-quinolinolato)zirconium (IV) with a light having an excitation wavelength of 375 nm, a PL spectrum having a maximum peak within 525 to 530 nm was obtained (FIG. 11A). As a result of an elementary analysis, the ratios of C, H, N, and Zr based on the weight of the tetrakis(8-quinolinolato)zirconium (IV) were 64.2%, 3.8%, 8.2%, and 13.2%, respectively. The product had a HOMO level of −5.52 and a LUMO level of −2.87, and had a decomposition temperature of 340° C. without a melting point.

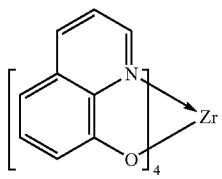

[Formula 2]

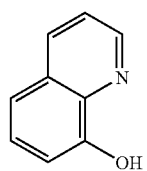

[Formula 13]

Figure 11B:
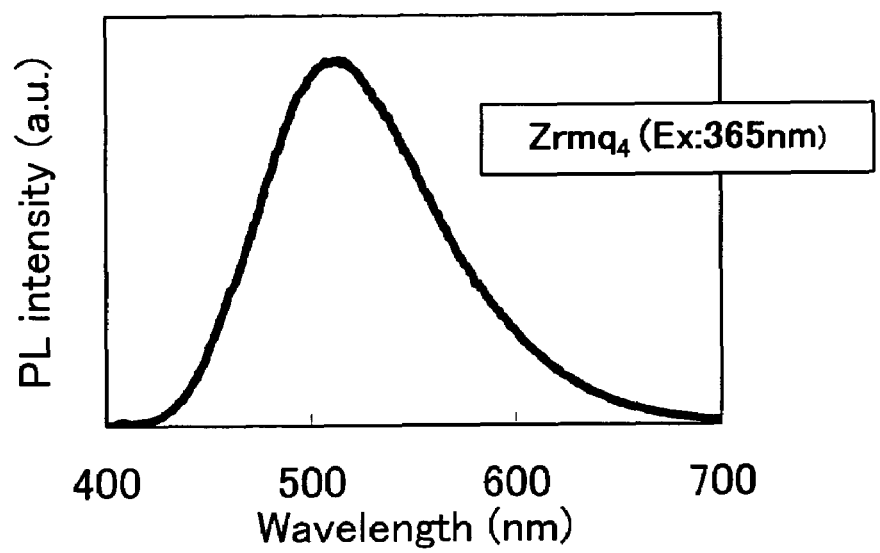

Tetrakis(2-methyl-8-quinolinolato)zirconium (IV) ($Zrmq_4$) represented by the chemical formula [Formula 3] can be produced by using 2-methyl-8-hydroxyquinoline represented by the chemical formula [Formula 14] instead of 8-hydroxyquinoline represented by the chemical formula [Formula 13]. Tetrakis(2-methyl-8-quinolinolato)zirconium (IV) was produced in the same manner as Synthesis Example 1, and the crude yield was 72% before the sublimation purification. As a result of irradiating a methanol solution of the tetrakis(2-methyl-8-quinolinolato)zirconium (IV) with a light having an excitation wavelength of 365 nm, a PL spectrum having a maximum peak within 510 to 515 nm was obtained (FIG. 11B). As a result of an elementary analysis, the ratios of C, H, N, and Zr based on the weight of the tetrakis(2-methyl-8-quinolinolato)zirconium (IV) were 65.5%, 4.7%, 7.6%, and 12.9%, respectively. The product had a decomposition temperature of 280° C.

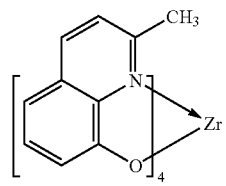

[Formula 3]

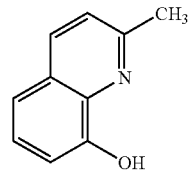

[Formula 14]

SYNTHESIS EXAMPLE 2

In Synthesis Example 2, a method for synthesizing an Hf complex tetrakis(8-quinolinolato)hafnium (IV), which is a complex of a Group 4 metal of the periodic table with the central metal of Hf, is described.

Tetrakis(8-quinolinolato)hafnium ($Hfq_4$) and tetrakis(2-methyl-8-quinolinolato)hafnium ($Hfmq_4$) can be synthesized respectively by using hafnium chloride instead of zirconium chloride in the above cases of Synthesis Example 1.

Tetrakis(8-quinolinolato)hafnium and tetrakis(2-methyl-8-quinolinolato)hafnium were synthesized in the same manner as Synthesis Example 1, and the crude yields were 92% and 69% respectively before the sublimation purification.

Figure 12A:
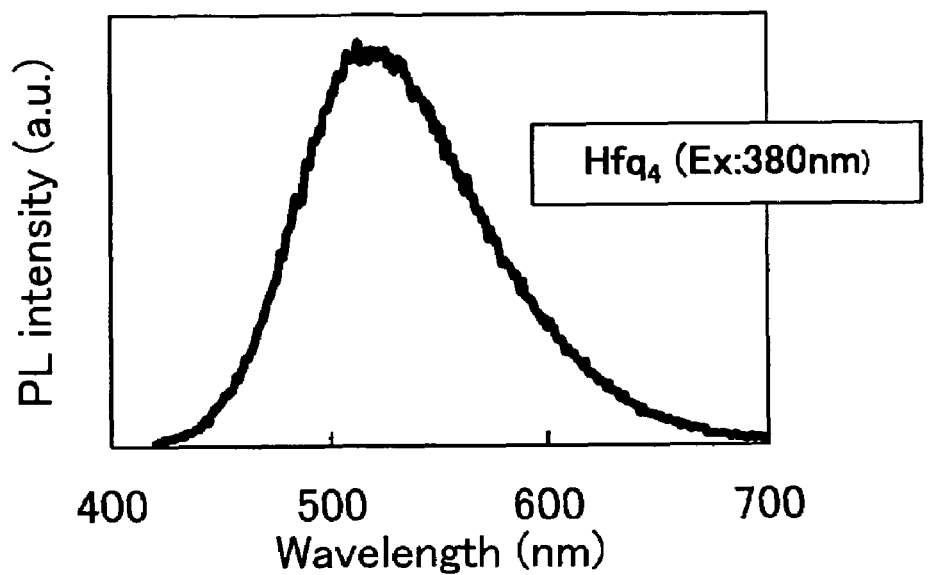
FIGS. 12A and 12B are graphs showing PL spectra of Hf complexes in methanol.
Figure 12B:
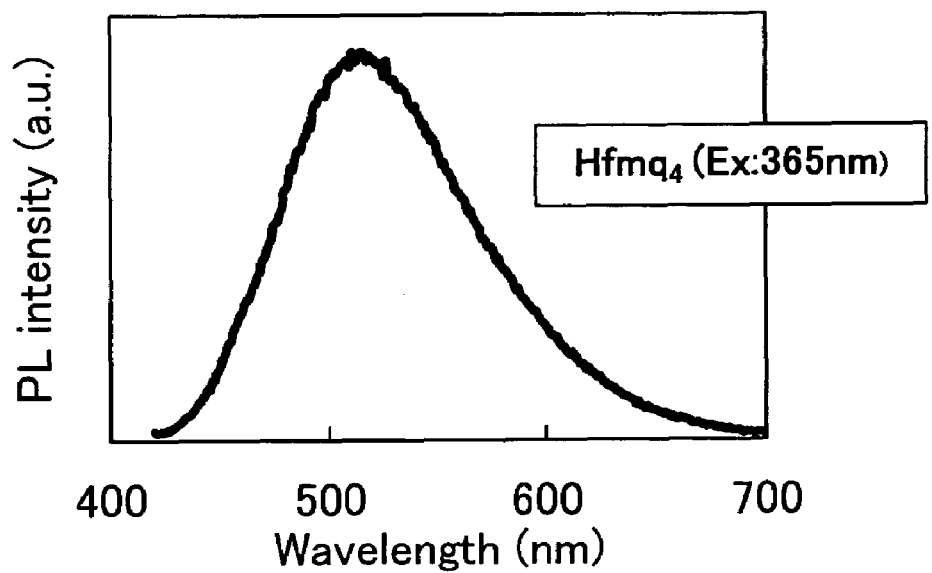

As a result of irradiating each of a methanol solution of the tetrakis(8-quinolinolato)hafnium and a methanol solution of the tetrakis(2-methyl-8-quinolinolato)hafnium with a light having an excitation wavelength of 380 nm or 365 nm, PL spectra having a maximum peak within 516 to 521 nm or 513 to 518 nm were obtained respectively (FIGS. 12A and 12B).

As a result of an elementary analysis, the ratios of C, H, N, and Hf based on the weight of the tetrakis(8-quinolinolato) hafnium were 56.7%, 3.2%, 7.2%, and 22.9% respectively, and the ratios of C, H, N, and Hf based on the weight of the tetrakis(2-methyl-8-quinolinolato)hafnium were 58.4%, 4.0%, 6.5%, and 21.7% respectively. The decomposition temperatures of the tetrakis(8-quinolinolato)hafnium and the tetrakis(2-methyl-8-quinolinolato)hafnium were 340° C. and 280° C., respectively.

EXAMPLE 2

In this Example, production of an electroluminescent element using a complex of a Group 4 metal of the periodic table in a light emitting layer, particularly using a Zr complex with a central metal of Zr, is described. In this Example, the electroluminescent element having the structure of Embodiment 1 is described with reference to FIG. 4.

First a first electrode 401 of the electroluminescent element is formed on a substrate 400. In this Example, the first electrode 401 acts as an anode. The first electrode 401 is formed by a sputtering method into a thickness of 110 nm using a transparent electrically conductive film material of ITO.

Then, an electroluminescence layer 402 is formed on the first electrode (the anode) 401. In this Example, the electroluminescence layer 402 has a laminate structure composed of a hole injecting layer 411, a hole transporting layer 412, and an electron transporting light emitting layer 413, and the Zr complex represented by the chemical formula [Formula 2] is used in the electron transporting light emitting layer 413.

First the substrate with the first electrode 401 formed is fixed to a substrate holder of a commercially available vacuum deposition apparatus such that the first electrode 401 faces downward. Copper phthalocyanine (hereinafter referred to as Cu—Pc) is put in a vapor source in the vacuum deposition apparatus, the 20-nm-thick hole injecting layer 411 is formed by a resistance heating vapor deposition method.

Then, the hole transporting layer 412 is formed using a material with excellent hole transporting properties. In this Example, 4,4'-bis[N-(1-naphthyl)-N-phenyl-amino (hereinafter referred to as α-NPD) is formed into a layer with a thickness of 30 nm in the same manner.

Next the electron transporting light emitting layer 413 is formed. In this Example, 50-nm-thick electron transporting light emitting layer is formed by a vapor deposition method using the Zr complex tetrakis(8-quinolinolato)zirconium (IV) represented by the chemical formula [Formula 2].

Then, a second electrode 403, which acts as a cathode, is formed. In this Example, the second electrode 403 is formed such that a calcium fluoride (CaF) layer 414 (2 nm) is formed on the electroluminescence layer 402 by a vapor deposition method, and an aluminum (Al) layer 415 (100 nm) is stacked thereon by a sputtering method.

Thus, the electroluminescent element using the Zr complex for the electron transporting light emitting layer 413 is produced. The structure of Example 2 is a single heterostructure in which the electroluminescence layer 402 has the hole injecting layer 411, the hole transporting layer 412, and the electron transporting light emitting layer 413. Further, the Zr complex is excellent in film forming properties and carrier transporting properties, emits a light in the solid state, and is thereby capable of forming a stable device with a high light emitting efficiency.

Although in this Example the first electrode 401 formed on the substrate is composed of an anode material and acts as an anode, the invention is not restricted thereto and the first electrode 401 may be composed of a cathode material to act as a cathode. In this case of exchanging the anode and the cathode, the layers forming the electroluminescence layer are stacked in the order reverse to that of this Example. Further, although in this Example the first electrode (the anode) 401 is a transparent electrode and the light produced in the electroluminescence layer 413 is taken out from the first electrode (the anode) 401 side, the invention is not restricted thereto and the light may be taken out from the second electrode (the cathode) 403 side by selecting a material suitable for maintaining the transparency.

EXAMPLE 3

In this Example, production of an electroluminescent element using a complex of a Group 4 metal of the periodic table in a light emitting layer, particularly using a Zr complex with a central metal of Zr (tetrakis(8-quinolinolato)zirconium (IV) represented by the general formula [Formula 2]), is described. In this Example, the electroluminescent element, which has the electron transporting light emitting layer with the doping layer formed by codeposition of the host material of the Zr complex and the guest material as described in Embodiment 2, is described with reference to FIG. 5.

The structure of Example 3 is similar to the structure of Example 2, and different from the structure of Example 2 in that an electron transporting light emitting layer 513 comprises a portion 515 (30 nm) composed of the complex of a Group 4 metal of the periodic table and a doping layer 514 formed by codeposition with the guest material.

Figure 5:
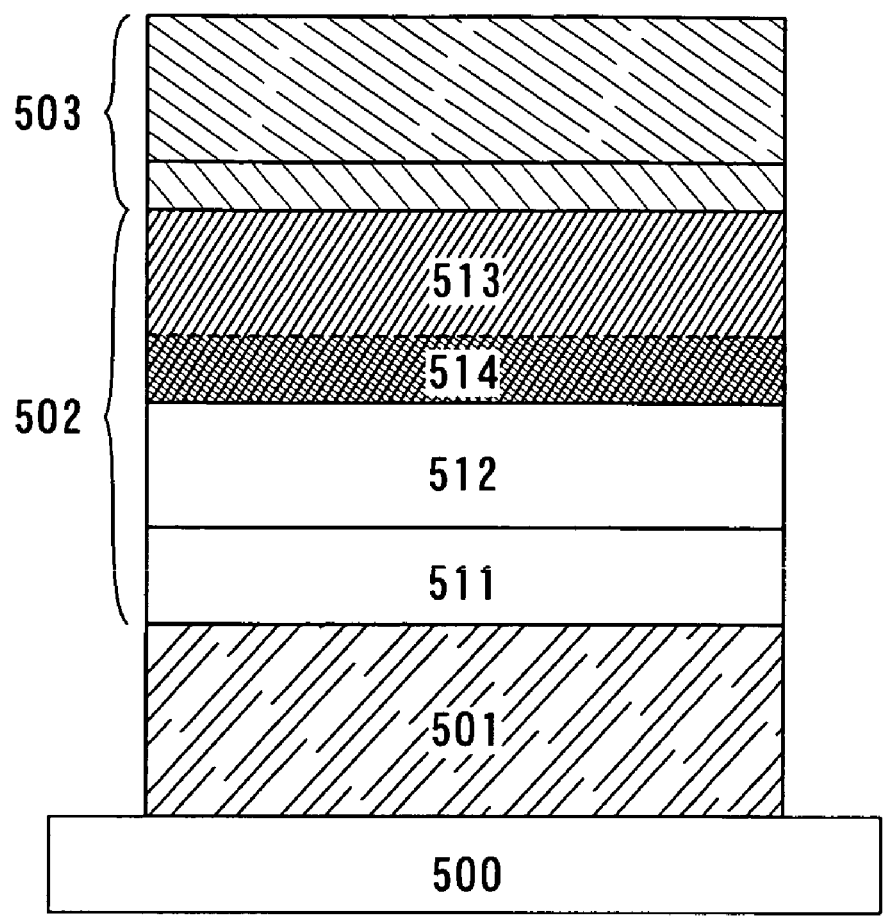
FIG. 5 is a view showing the structure of the electroluminescent element of Example 3.

Thus, a first electrode 501, a hole injecting layer 511, a hole transporting layer 512, and a second electrode 503 are formed on a substrate 500 as shown in FIG. 5 by using the same materials into the same thickness as the electrode 403 of Example 2.

The doping layer 514 is formed as a part of the electron transporting light emitting layer 513. The doping layer 514 is formed on the side of the electron transporting light emitting layer 513 in contact with the hole transporting layer 512, and in this Example, the doping layer 514 is formed into a thickness of 20 nm by codepositing the Zr complex (tetrakis(8-quinolinolato)zirconium (IV)) and a red light emitting guest material DCM2.

Then, only tetrakis(8-quinolinolato)zirconium (IV) is formed into a layer with a thickness of 30 nm by a vapor deposition method. In such a structure, the light provided by the doping layer 514 is prevented from being quenched in the vicinity of the second electrode 503.

The structure of Example 3 is such that the light emitting layer of the single heterostructure of Example 2 is partly doped with the guest material.

EXAMPLE 4

Figure 6:
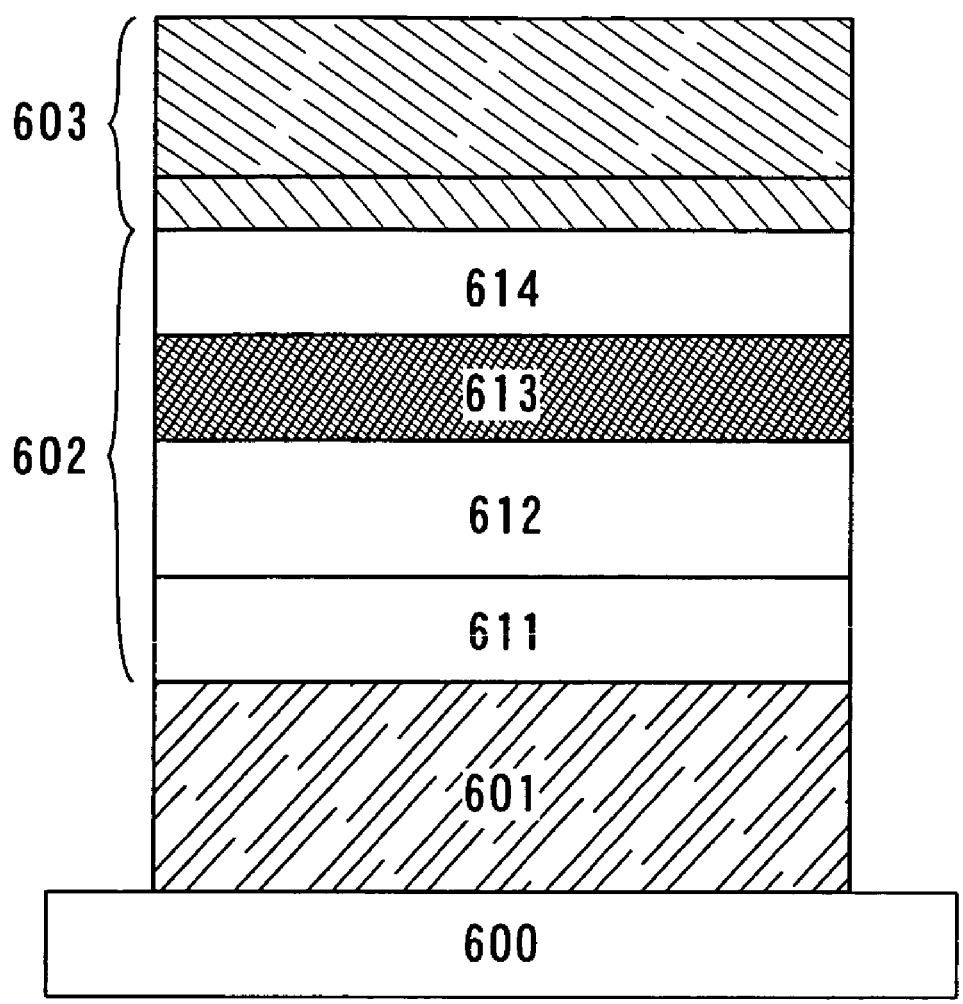
FIG. 6 is a view showing the structure of the electroluminescent element of Example 4.

In this Example, production of an electroluminescent element using a complex of a Group 4 metal of the periodic table in a light emitting layer, particularly using a Zr complex with a central metal of Zr (tetrakis(8-quinolinolato)zirconium (IV) represented by the general formula [Formula 2]), is described. In this Example, the electroluminescent element, which has a light emitting layer formed by codepositing a host material of the Zr complex and a guest material, and has an electron transporting layer formed between a light emitting layer and a second electrode, as described in Embodiment 3, is described with reference to FIG. 6.

The structure of Example 4 is similar to the structure of Example 2, and different in the constitution of a light emitting layer 613 and in point of having an electron transporting layer 614.

Figure 4:
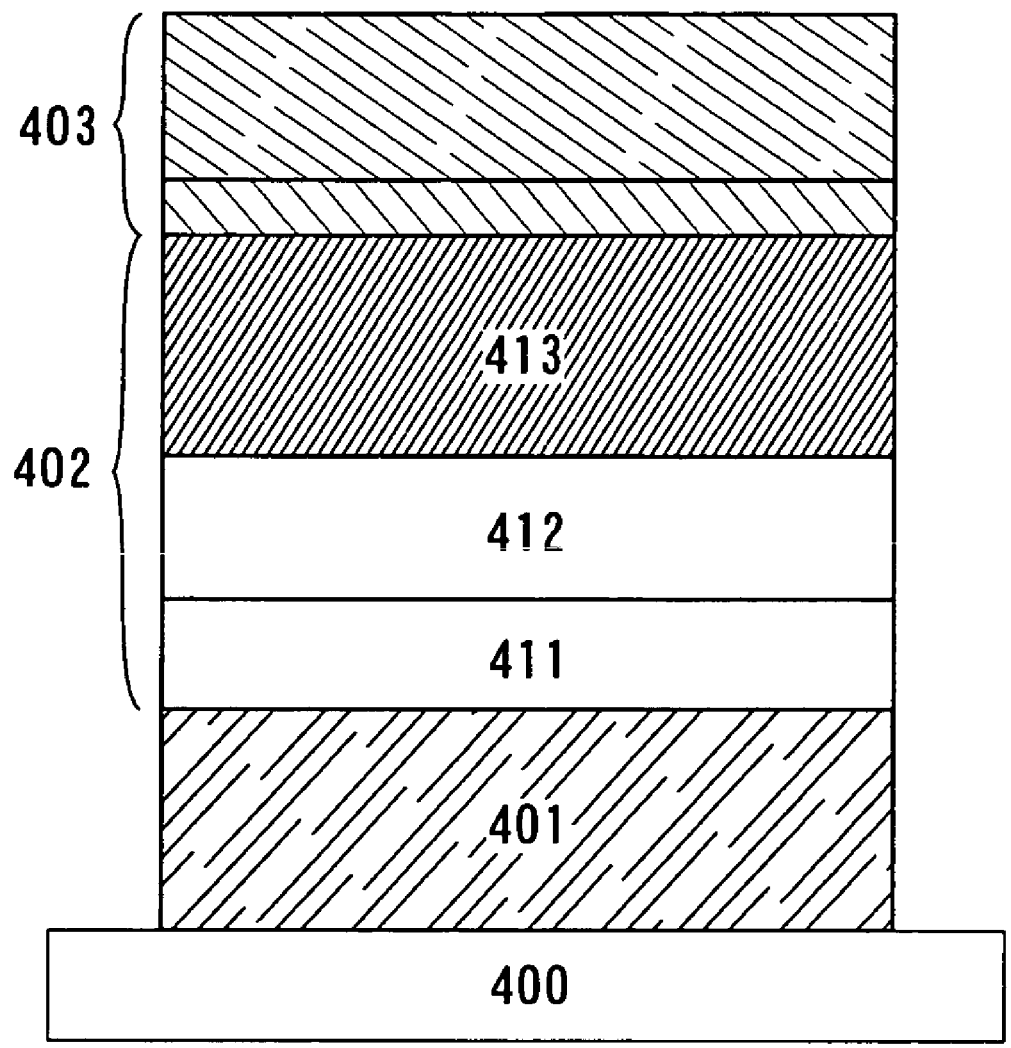
FIG. 4 is a view showing the structure of the electroluminescent element of Example 2.

Thus, a first electrode 601, a hole injecting layer 611, a hole transporting layer 612, and a second electrode 603 are formed on a substrate 600 as shown in FIG. 4 by using the same materials into the same thickness as the second electrode 403 of Example 2.

The light emitting layer 613 of this Example is formed into a thickness of 20 nm by codepositing the host material of the Zr complex (tetrakis(8-quinolinolato)zirconium (IV)) and a red light emitting guest material DCM2.

Further, the electron transporting layer 614 is formed by depositing BCP into a thickness of 20 nm.

The electroluminescence layer 602 of this Example is formed as above. The structure of the electroluminescent element of this Example is a function-separated structure (a so-called double heterostructure), in which the hole transporting layer 612 and the electron transporting layer 614 are formed separately from the light emitting layer 613, to be different from those of Examples 2 and 3. The structure is preferred in the viewpoint of increasing the light emitting efficiency.

EXAMPLE 5

Figure 7:
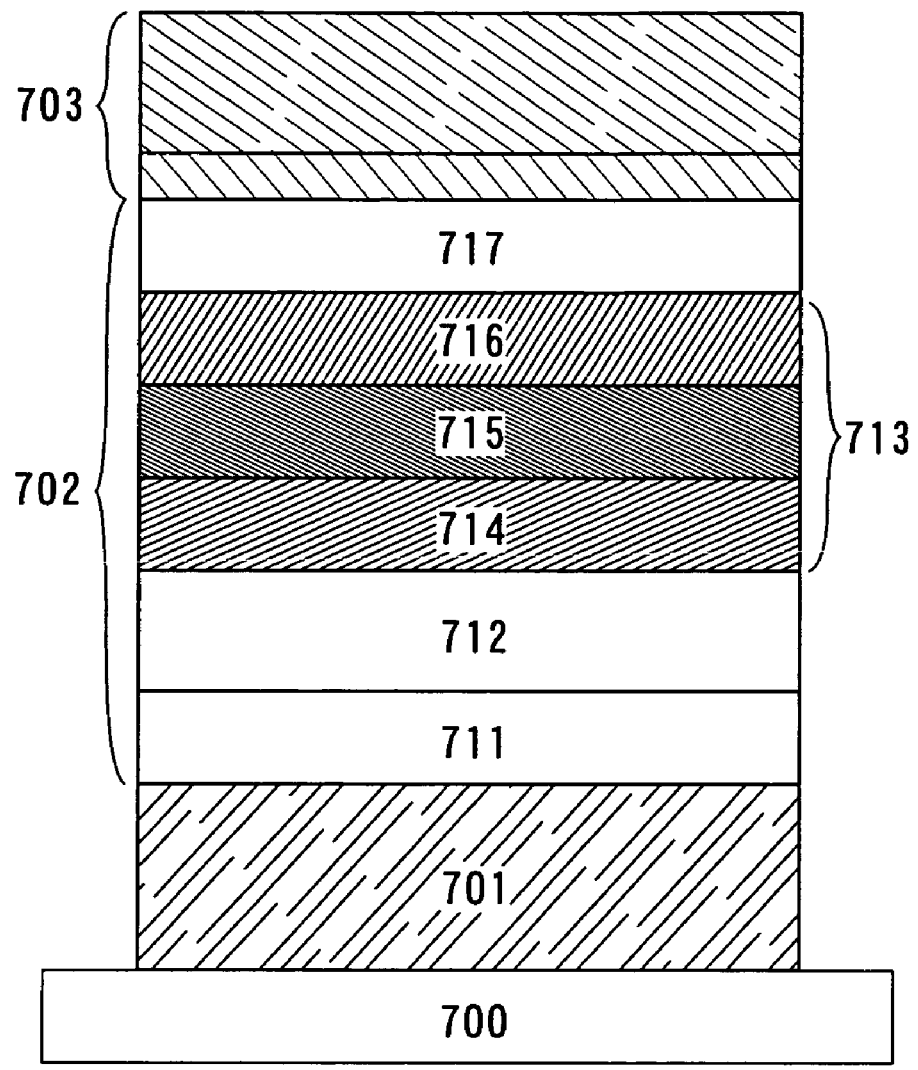
FIG. 7 is a view showing the structure of the electroluminescent element of Example 5.

In this Example, production of an electroluminescent element using a complex of a Group 4 metal of the periodic table in a light emitting layer, particularly using a Zr complex with a central metal of Zr (tetrakis(8-quinolinolato)zirconium (IV) represented by the general formula [Formula 2]), is described. Described in this Example with reference to FIG. 7 is such an electroluminescent element that a light emitting layer is formed by stacking a plurality of layers to emit a white light and the Zr complex is used as a host material or a guest material in a part thereof.

The structure of Example 5 is similar to the structure of Example 4, and different in a light emitting layer 713 with a laminate structure comprising a first layer 714, a second layer 715, and a third layer 716.

A first electrode 701, a hole injecting layer 711, a hole transporting layer 712, and a second electrode 703 are formed on a substrate 700 in the same manner using the same materials as the second electrode 403 of Example 2.

The first layer 714 of the light emitting layer 713 of this Example is formed into a thickness of 10 nm by codepositing α-NPD and perylene. The perylene content is 1 wt %. The first layer 714 emits a blue light due to the guest material of perylene.

The second layer 715 laminated thereon is formed into a thickness of 10 nm by codepositing BAlq$_2$ and the Zr complex tetrakis(8-quinolinolato)zirconium (IV) (referred to as Zrq$_4$). The Zrq$_4$ content is 5 wt %. The second layer 715 emits a green light due to the guest material of Zrq$_4$.

The third layer 716 laminated thereon is formed into a thickness of 10 nm by codepositing Zrq$_4$ and DCM2. The DCM2 content is 1 wt %. The third layer 716 emits a red light due to the guest material of DCM2.

Further, an electron transporting layer 717 is formed by depositing Zrq$_4$ into a thickness of 30 nm.

The electroluminescence layer 702 of this Example is formed as above. The structure of the electroluminescent element of this Example is such that the light emitting layer 713 is formed by stacking the first layer 714 emitting a blue light, the second layer 715 emitting a green light, and the third layer 716 emitting a red light, and the light emitting layer 713 emits a white light in the aggregate. The structure of the device of this Example is advantageous in that Zrq$_4$ is used commonly in the second layer 715 and the third layer 716 to make the production easy.

The white light emitting electroluminescent element of this Example can be easily converted into a full-color device by using a color filter in combination.

EXAMPLE 6

Results of measuring light emitting properties of a Zr complex used as a host material as described in Embodiments 2 and 3 and a conventional host material Alq$_3$ are described in this Example.

FIG. 8A shows luminescence spectra (PL spectra) obtained by irradiating a deposited layer of the Zr complex tetrakis(8-quinolinolato)zirconium (IV) (referred to as Zrq$_4$) and a deposited layer of the Al complex tris(8-quinolinolato)aluminum (referred to as Alq$_3$) with a light having an excitation wavelength of 395 or 347 nm respectively.

It is clear therefrom that Zrq$_4$ has the PL spectrum on a longer wavelength side than Alq$_3$. Thus, in the case of combining the Zr complex with a guest material having a longer emission wavelength (DCM1, DCM2, etc. emitting a red light), the energy gap between the host material and the guest material is reduced to achieve more efficient light emission.

FIG. 8B shows electroluminescence spectra (EL spectra) of electroluminescent elements obtained by using the Zr complex tetrakis(8-quinolinolato)zirconium (IV) (referred to as Zrq$_4$) and the Al complex tris(8-quinolinolato)aluminum (referred to as Alq$_3$) respectively.

The electroluminescent element using Alq$_3$ in a part of an electroluminescence layer is shown as Device 1 in FIG. 8B, and has a structure of ITO (anode)/Cu—Pc/α-NPD/Alq$_3$/CaF/Al (cathode) stacked in this order. The electroluminescent element using Zrq$_4$ in a part of an electroluminescence layer is shown as Device 2, and has a structure of ITO (anode)/Cu—Pc/α-NPD/Zrq$_4$/CaF/Al (cathode) stacked in this order.

Though the EL spectra of Zrq$_4$ and Alq$_3$ are shifted to a shorter wavelength side as compared with the PL spectra of the simple films shown in FIG. 8A, it is clear also from the EL spectra that the electroluminescent element using Zrq$_4$ has the EL spectrum on a longer wavelength side than the electroluminescent element using Alq$_3$. Thus, the Zr complex is suitable for producing an electroluminescent element using a guest material having a longer emission wavelength (DCM1, DCM2, etc. emitting a red light).

EXAMPLE 7

In Example 7, a light emitting device having an electroluminescent element of the invention in a pixel portion is described with reference to FIGS. 9A and 9B. FIG. 9A is a top view showing the light emitting device, and FIG. 9B is a cross-sectional view showing the apparatus of FIG. 9A taken along the line A-A'. 901 shown as a dotted line represents a drive circuit portion (a source drive circuit), 902 represents pixel portion, and 903 represents a drive circuit portion (a gate drive circuit). Further, 904 represents a sealing plate, 905 represents a sealant, and there is a space 907 surrounded by the sealant 905.

A wiring 908 is for transmitting signals to be input into the source drive circuit 901 and the gate drive circuit 903, and receives a video signal, a clock signal, a start signal, a reset signal, etc. from an external input terminal of an FPC (flexible print circuit) 909. The FPC may be equipped with a printed wiring board (PWB) though only the FPC is shown herein. The term "a light emitting device" used in the invention means not only a light emitting device per se but also a light emitting device connected to an FPC or a PWB.

Next the cross section structure is explained with FIG. 9B. The drive circuit portion and a pixel portion are formed on a substrate 910, and herein the source drive circuit 901 of the drive circuit portion and a pixel portion 902 are shown.

The source drive circuit 901 comprises a CMOS circuit using an n-channel TFT 923 and a p-channel TFT 924 in combination. The TFT forming the drive circuit may comprise a known CMOS, PMOS or NMOS circuit. Though the light emitting device shown in this embodiment is a driver-integrated type apparatus with the drive circuit formed on the substrate, the driver is not necessarily integrated and the drive circuit may be not on the substrate but outside.

The pixel portion 902 is composed of a plurality of pixels containing a switching TFT 911, a current controlling TFT 912, and a first electrode 913 electrically connected to the drain thereof. An insulator 914 is formed to cover an edge of the first electrode 913. The insulator 914 is composed of a positive type, photosensitive acrylic resin film.

To improve the coverage, a curved surface with a curvature is formed on the top or the bottom of the insulator 914. For example, in the case of using a positive type, photosensitive acrylic resin as a material for the insulator 914, it is preferred that a curved surface with a curvature radius (0.2 to 3 μm) is formed only on the top of the insulator 914. The insulator 914 may be composed of a negative type photosensitive material that is made insoluble in an etchant by light, or a positive type material that is made soluble in an etchant by light.

An electroluminescence layer 916 and a second electrode 917 are each formed on the first electrode 913. The first electrode 913, which acts as an anode, is preferably made of a material with a large work function. For example, the first electrode 913 may be a single-layered film such as an ITO (indium tin oxide) film, an indium zinc oxide (IZO) film, a titanium nitride film, a chromium film, a tungsten film, a Zn film, and a Pt film; a two-layered laminate of a titanium nitride film and a film comprising aluminum as a main component; a three-layered laminate of a titanium nitride film, a film comprising aluminum as a main component, and a titanium nitride film; etc. The first electrode having a laminate structure has a low resistance as a wiring, is excellent in ohmic contact, and further can act as an anode.

The electroluminescence layer 916 may be formed by a vapor deposition method using a deposition mask, or an ink-jet method. The complex of a Group 4 metal of the periodic table is used in a part of the electroluminescence layer 916, and a low or high molecular weight material may be used in combination. Though it is generally often the case that the electroluminescence layer is a single layer or a laminate of an organic compound, the electroluminescence layer may be an organic compound film using an inorganic compound partly in the invention. Further, a known triplet material may be used in the electroluminescence layer.

Further, the second electrode (cathode) 917 formed on the electroluminescence layer 916 may be made of a material with a small work function (Al, Ag, Li, Ca, an alloy thereof, MgAg, MgIn, AlLi, $CaF_2$, CaN, etc.) In the case where the light produced in the electroluminescence layer 916 is transmitted through the second electrode 917, the second electrode (cathode) 917 is preferably a laminate of a thin metal film having a small thickness and a transparent conductive film of an ITO (an indium oxide-tin oxide alloy), an indium oxide-zinc oxide alloy ($In_2O_3$—ZnO), zinc oxide (ZnO), etc.

The sealing substrate 904 is attached to the device substrate 910 by the sealant 905, whereby the structure is such that an electroluminescent element 918 is formed in the space 907 surrounded by the device substrate 910, the sealing substrate 904, and the sealant 905. The space 907 may be filled with an inert gas such as nitrogen and argon, or with the sealant 905.

The sealant 905 is preferably an epoxy resin. It is preferred that a more moisture- and oxygen-impermeable material is used for the sealant. The sealing plate 904 may be a glass plate, a quartz plate, or a plastic plate of an FRP (Fiberglass-Reinforced Plastics), a PVF (polyvinyl fluoride), a mylar, a polyester, an acrylic, etc.

The light emitting device comprising the electroluminescent element of the invention can be obtained in the above-described manner.

The light emitting device of this Example may have the structures of the electroluminescent elements of Examples 2 to 5 combined freely.

EXAMPLE 8

In Example 8, various electronic apparatuses using a light emitting device with the electroluminescent element of the invention are described.

Examples of the electronic apparatuses using a light emitting device with the electroluminescent element of the invention include video cameras, digital cameras, goggle-type displays (head-mounted displays), navigation systems, sound playback systems (car audios, audio component systems, etc.), notebook personal computers, game machines, personal digital assistants (mobile computers, cellular phones, portable game machines, electronic books, etc.), picture reproducers with a recording unit (specifically apparatuses equipped with a display unit, capable of playing a recording medium such as a DVD (Digital Versatile Disc) and showing the image in the display unit), etc. Specific examples of the electronic apparatuses are shown in FIGS. 10A to 10G.

FIG. 10A shows a display apparatus comprising an enclosure 2001, a support 2002, a display part 2003, speakers 2004, a video input terminal 2005, etc. The display apparatus is produced by using the light emitting device having the electroluminescent element of the invention in the display part 2003. The display apparatus may be any information displaying apparatus for a personal computer, TV broadcast reception, advertisement display, etc.

FIG. 10B shows a notebook personal computer comprising a body 2201, an enclosure 2202, a display part 2203, a keyboard 2204, an external connection port 2205, a pointing mouse 2206, etc. The notebook personal computer is produced using the light emitting device having the electroluminescent element of the invention in the display part 2203.

FIG. 10C shows a mobile computer comprising a body 2301, a display part 2302, a switch 2303, operation keys 2304, an infrared port 2305, etc. The mobile computer is produced using the light emitting device having the electroluminescent element of the invention in the display part 2302.

FIG. 10D shows a portable picture reproducer with a recording unit (specifically a DVD playing apparatus) comprising a body 2401, an enclosure 2402, a display part A 2403, a display part B 2404, a recording medium (DVD, etc.) reading part 2405, operation keys 2406, a speaker 2407, etc. The display part A 2403 mainly shows image information and the display part B 2404 mainly shows character information, and the portable picture reproducer is produced by using the light emitting device having the electroluminescent element of the invention in the display parts A and B, 2403 and 2404. The picture reproducers with a recording unit include home-use game machines, etc.

FIG. 10E shows a goggle display (a head-mounted display) comprising a body 2501, a display part 2502, and arms 2503. The goggle-type display is produced using the light emitting device having the electroluminescent element of the invention in the display part 2502.

FIG. 10F shows a video camera comprising a body 2601, a display part 2602, an enclosure 2603, an external connection port 2604, a remote control receiver 2605, an image receiver 2606, a battery 2607, an audio input 2608, operation keys 2609, an eyepiece 2610, etc. The video camera is produced using the light emitting device having the electroluminescent element of the invention in the display part 2602.

FIG. 10G shows a cellular phone comprising a body 2701, an enclosure 2702, a display part 2703, an audio input 2704, an audio output 2705, operation keys 2706, an external connection port 2707, an antenna 2708, etc. The cellular phone is produced using the light emitting device having the electroluminescent element of the invention in the display part 2703. The power consumption of the cellular phone can be reduced by using the display part 2703 such that white letters are shown in a black background.

As described above, the light emitting device having the electroluminescent element of the invention is capable of remarkably wide application, and can be applied to various electronic apparatus of in all fields.

The invention claimed is:

1. An electroluminescent element comprising:
an anode,
a cathode, and
an electroluminescence layer comprising a first layer and a second layer,
wherein the first and second layers comprise a complex of a Group 4 metal of the periodic table represented by the general formula:

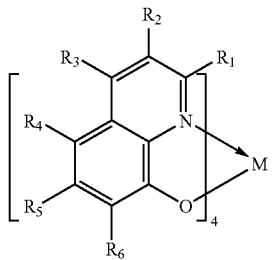

wherein M represents a Group 4 element of the periodic table, and R1 to R6 independently represent a hydrogen, a halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocycle residue, and
wherein the second layer further comprises a light emitting material which has an emission wavelength with a maximum value within a range of 580 to 680 nm,
wherein the metal complex represented by the general formula in the first layer is a guest material and the metal complex represented by the general formula in the second layer is a host material.

2. An electroluminescent element comprising:
an anode,
a cathode, and
an electroluminescence layer comprising a first layer and a second layer,
wherein the first and second layers comprise a complex of a Group 4 metal of the periodic table represented by the general formula:

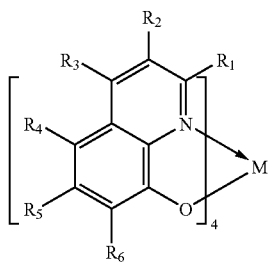

wherein M represents a Group 4 element of the periodic table, and R1 to R6 independently represent a hydrogen, a halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocycle residue, and
wherein the second layer her comprises a light emitting material which emits a red light,
wherein the metal complex represented by the general formula in the first layer is a guest material and the metal complex represented by the general formula in the second layer is a host material.

3. An electroluminescent element comprising:
an anode,
a hole injection layer over the anode,
a hole transporting layer over the hole injection layer,
a electron injection layer over the hole transporting layer,
a cathode, and
an electroluminescence layer comprising a first layer and a second layer interposed between the hole transporting layer and the electron injection layer,
wherein the first and second layers comprise a complex of a Group 4 metal of the periodic table represented by the general formula:

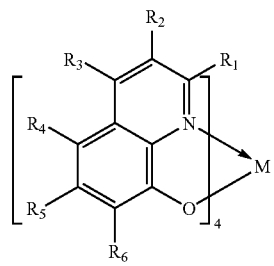

wherein M represents a Group 4 element of the periodic table, and R1 to R6 independently represent a hydrogen, a halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocycle residue,
wherein the metal complex represented by the general formula in the first layer is a guest material and the metal complex represented by the general formula in the second layer is a host material.

4. An electroluminescent element comprising:
an anode,
a cathode, and
an electroluminescence layer comprising:
a first light emitting layer, and
a second light emitting layer,
wherein both the first light emitting layer and the second light emitting layer comprise a complex of a Group 4 metal of the periodic table represented by the general formula:

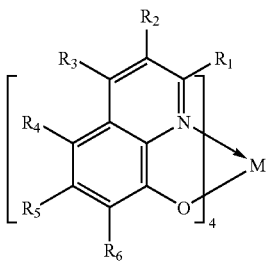

wherein M represents a Group 4 element of the periodic table, and R1 to R6 independently represent a hydrogen, a halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocycle residue, wherein the metal complex represented by the general formula in the first layer is a guest material and the metal complex represented by the general formula in the second layer is a host material.

5. The electroluminescent element according to claim 4, wherein the second layer further comprises a light emitting material which has an emission wavelength with a maximum value within a range of 580 to 680 nm.

6. The electroluminescent element according to claim 5, wherein the light emitting material emits a red light.

7. The electroluminescent element according to claim 4, wherein said electroluminescent element is incorporated into a light emitting device.

8. The electroluminescent element according to claim 1, wherein the electroluminescent element is incorporated into a light emitting device.

9. The electroluminescent element according to claim 2, wherein the electroluminescent element is incorporated into a light emitting device.

10. The electroluminescent element according to claim 3, wherein the second layer further comprises a light emitting material which has an emission wavelength with a maximum value within a range of 580 to 680 nm.

11. The electroluminescent element according to claim 10, wherein the light emitting material emits a red light.

12. The electroluminescent element according to claim 3, wherein the electroluminescent element is incorporated into a light emitting device.

13. An electroluminescent element comprising:
an anode;
an electroluminescence layer comprising a first layer and a second layer over the anode; and
a cathode over the electroluminescence layer comprising the first and second layers,
wherein the first layer and the second layer have a metal complex represented by the general formula:

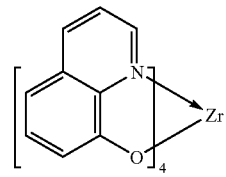

wherein the metal complex represented by the general formula in the first layer is a guest material and the metal complex represented by the general formula in the second layer is a host material.

14. The electroluminescent element according to claim 13, wherein the second layer further comprises a light emitting material which has an emission wavelength with a maximum value within a range of 580 to 680 nm.

15. The electroluminescent element according to claim 14, wherein the light emitting material emits a red light.

16. The electroluminescent element according to claim 13, wherein the electroluminescent element is incorporated into a light emitting device.

* * * * *